(12) United States Patent
Zhao et al.

(10) Patent No.: US 12,193,314 B2
(45) Date of Patent: Jan. 7, 2025

(54) METHOD OF FABRICATING DISPLAY PANEL USING ELECTRIC FIELD, AND DRYING DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Jinyang Zhao, Guangdong (CN); Lixuan Chen, Guangdong (CN); Zhiqing Shi, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 529 days.

(21) Appl. No.: 17/600,075

(22) PCT Filed: Aug. 30, 2021

(86) PCT No.: PCT/CN2021/115394
§ 371 (c)(1),
(2) Date: Sep. 29, 2021

(87) PCT Pub. No.: WO2023/019635
PCT Pub. Date: Feb. 23, 2023

(65) Prior Publication Data
US 2023/0056379 A1    Feb. 23, 2023

(30) Foreign Application Priority Data
Aug. 18, 2021   (CN) .......................... 202110947664.9

(51) Int. Cl.
*H10K 71/00*   (2023.01)
*H10K 50/115*  (2023.01)
*H10K 59/12*   (2023.01)

(52) U.S. Cl.
CPC .......... *H10K 71/00* (2023.02); *H10K 50/115* (2023.02); *H10K 59/12* (2023.02); *H10K 59/1201* (2023.02)

(58) Field of Classification Search
None
See application file for complete search history.

(56) References Cited

U.S. PATENT DOCUMENTS

| 2002/0158835 A1 | 10/2002 | Kobayashi et al. |
| 2006/0125363 A1 * | 6/2006 | Tahira ............... H05B 33/10 |
| | | 313/29 |

(Continued)

FOREIGN PATENT DOCUMENTS

| CN | 102765261 A | 11/2012 |
| CN | 106935723 A | 7/2017 |

(Continued)

OTHER PUBLICATIONS

International Search Report and Written Opinion (with English translation) in International application No. PCT/CN2021/115394, mailed on Apr. 28, 2022, 18 pages provided.

(Continued)

*Primary Examiner* — Bilkis Jahan
(74) *Attorney, Agent, or Firm* — HSML P. C.

(57) ABSTRACT

A fabrication method of a display panel and a drying device are provided by the present application. In the display panel of the present application, an electrical field for drying on a pixel electrode layer is used to fix charged groups in a solution of a light-emitting functional layer, which prevents a solvent from driving the movement of the charged groups (Continued)

when the solvent is volatilized, thereby obtaining a light-emitting functional layer with a uniform film thickness. Moreover, the use of the electric field for drying fixes the charged groups so that a drying treatment is performed without strict pumping control during the solvent volatilization process.

20 Claims, 3 Drawing Sheets

(56) References Cited

U.S. PATENT DOCUMENTS

| | | | |
|---|---|---|---|
| 2019/0067389 A1* | 2/2019 | Ai | H10K 50/11 |
| 2019/0189713 A1 | 6/2019 | Kondo | |
| 2019/0198591 A1* | 6/2019 | Dai | H10K 50/814 |
| 2020/0083488 A1* | 3/2020 | Zhang | H10K 71/13 |
| 2020/0192151 A1 | 6/2020 | Dai | |
| 2022/0072864 A1 | 3/2022 | Kim et al. | |
| 2022/0080725 A1 | 3/2022 | Lee et al. | |

FOREIGN PATENT DOCUMENTS

| | | | |
|---|---|---|---|
| CN | 106953030 A | 7/2017 |
| CN | 107331788 A | 11/2017 |
| CN | 107579099 A | 1/2018 |
| CN | 107665958 A | 2/2018 |
| CN | 107871828 A | 4/2018 |
| CN | 107962877 A | 4/2018 |
| CN | 108346747 A | 7/2018 |
| CN | 108389965 A | 8/2018 |
| CN | 108428720 A | 8/2018 |
| CN | 110137366 A | 8/2019 |
| CN | 111516391 A | 8/2020 |
| CN | 112736214 A | 4/2021 |
| CN | 113036066 A | 6/2021 |
| CN | 113226776 A | 8/2021 |
| CN | 113272145 A | 8/2021 |
| EP | 3904103 A1 | 11/2021 |
| EP | 3907082 A1 | 11/2021 |
| JP | 2006202597 A | 8/2006 |
| JP | 2009291755 A | 12/2009 |
| JP | 2012194313 A | 10/2012 |
| JP | 2018078094 A | 5/2018 |
| JP | 2019110115 A | 7/2019 |
| JP | 2021057227 A | 4/2021 |
| JP | 2022517469 A | 3/2022 |
| KR | 20200079378 A | 7/2020 |
| KR | 20200084476 A | 7/2020 |
| WO | 2018176744 A1 | 10/2018 |
| WO | 2020079378 A1 | 4/2020 |
| WO | 2020141652 A1 | 7/2020 |

OTHER PUBLICATIONS

Chinese Office Action issued in corresponding Chinese Patent Application No. 202110947664.9 dated Sep. 26, 2021, pp. 1-9, with English translation.

Chinese Office Action issued in corresponding Chinese Patent Application No. 202110947664.9 dated Oct. 25, 2021, pp. 1-7, with English translation.

Chinese Decision of Rejection issued in corresponding Chinese Patent Application No. 202110947664.9 dated Nov. 17, 2021, pp. 1-6, with English translation.

Japanese Office Action issued in corresponding Japanese Patent Application No. 2021-553021 dated Oct. 31, 2023, pp. 1-9, with English translation.

Japanese Office Action issued in corresponding Japanese Patent Application No. 2021-553021 dated Apr. 2, 2024, pp. 1-8, with machine translation.

* cited by examiner

METHOD OF FABRICATING DISPLAY PANEL USING ELECTRIC FIELD, AND DRYING DEVICE

FIELD OF INVENTION

The present application relates to the field of display technology, particularly to a fabrication method of a display panel and a drying device.

BACKGROUND

Organic light-emitting diode (OLED) displays fabricated by inkjet printing technology have been commercialized on a small scale in the field of medium-sized OLEDs. In the process of research and practice of the prior art, the inventors of the present application discovered that a solvent needs to be volatilized during the inkjet printing. This requires methods such as vacuum drying and heating to remove the solvent. For obtaining a film with good quality, a complicated air-evacuation process is required, and a special solvent is needed to be selected to suppress a coffee ring effect during vaporization of the solvent.

SUMMARY OF DISCLOSURE

An embodiment of the present application provides a fabrication method of a display panel and a drying device, which realizes drying of a light-emitting functional layer assisted by an electric field and avoids an appearance of a coffee ring in the light-emitting functional layer.

The present application provides a fabrication method of a display panel, comprising:
  providing a substrate;
  disposing a pixel electrode layer on the substrate;
  forming a solution of a light-emitting functional layer on the pixel electrode layer to form a substrate to be dried;
  transferring the substrate to be dried into a chamber;
  forming an electric field for drying on the pixel electrode layer;
  drying the substrate to be dried; and
  evacuating the chamber and discharging a solvent in the solution of the light-emitting functional layer under the electric field for drying to form a light-emitting functional layer.

Optionally, in some embodiments of the present application, a conductive member is disposed in the chamber, and the conductive member comprises a first conductive portion and a second conductive portion, and the pixel electrode layer comprises a first electrode portion and a second electrode part that are separated,
  wherein forming the electric field for drying on the pixel electrode layer comprises following steps:
  connecting the first conductive portion and the first electrode portion, and connecting the second conductive portion and the second electrode portion; and
  applying a first voltage to the first conductive portion and a second voltage to the second conductive portion, forming a voltage difference between the first electrode portion and the second electrode portion, so that the electric field for drying is formed between the first electrode portion and the second electrode portion.

Optionally, in some embodiments of the present application, the voltage difference is 1 volt to 500 volts.

Optionally, in some embodiments of the present application, the voltage difference is 5 volts to 200 volts.

Optionally, in some embodiments of the present application, an electric field intensity of the electric field for drying is from 0.01 volt/micrometer to 100 volt/micrometer.

Optionally, in some embodiments of the present application, the pixel electrode layer comprises a plurality of pixel electrodes, and the forming the solution of the light-emitting functional layer on the pixel electrode layer comprises following steps:
  forming an electric field for printing between the plurality of pixel electrodes; and
  printing the solution of the light-emitting functional layer on the plurality of pixel electrodes under the electric field for printing.

Optionally, in some embodiments of the present application, the pixel electrode layer comprises a plurality of pixel electrodes, and the plurality of pixel electrodes comprise a plurality of sub-pixel electrodes arranged in m rows and n columns, and a gap is formed between the electrodes in two adjacent sub-pixels, wherein m and n are positive integers greater than or equal to 1, and values of m and n are not equal to 1 at the same time,
  wherein forming the solution of the light-emitting functional layer on the pixel electrode layer comprises following steps:
  forming an electric field for printing between the plurality of sub-pixel electrodes; and
  printing the solution of the light-emitting functional layer on the plurality of pixel electrodes under the e electric field for printing.

Optionally, in some embodiments of the present application, after providing the substrate, further comprising following steps:
  disposing a plurality of thin film transistors on the substrate, wherein the thin film transistors are electrically connected to the plurality of sub-pixel electrodes,
  wherein each of the plurality of thin film transistors correspondingly controls a voltage of one row of the plurality of sub-pixel electrodes, or each of the plurality of thin film transistors correspondingly controls a voltage of one column of the plurality sub-pixel electrodes, or each of the plurality of thin film transistors correspondingly controls one of the plurality of sub-pixel electrodes;
  the plurality of thin film transistors controls formation of a voltage difference between the plurality of sub-pixel electrodes to form the electric field for printing between the plurality of sub-pixel electrodes.

Optionally, in some embodiments of the present application, a distance of the gap between the plurality of sub-pixel electrodes is 1 μm to 10 μm.

Optionally, in some embodiments of the present application, forming the solution of the light-emitting functional layer on the pixel electrode layer comprises following steps:
  disposing an electric field electrode layer on the substrate, wherein the electric field electrode layer is insulated from the plurality of the pixel electrode layers;
  forming an electric field for printing between the pixel electrode layer and the plurality of electric field electrode layers; and
  printing the solution of the light-emitting functional layer on the pixel electrode layer under the electric field for printing.

Optionally, in some embodiments of the present application, forming the electric field for printing between the pixel electrode layer and the electric field electrode comprises following steps:

applying a first voltage to the pixel electrode layer and a second voltage to the electric field electrode layer, forming a voltage difference between the pixel electrode layer and the electric field electrode layer, so that the electric field for printing is formed between the pixel electrode layer and the electric field electrode layer.

Optionally, in some embodiments of the present application, the pixel electrode layer comprises a plurality of pixel electrodes, and after disposing the pixel electrode layer on the substrate, further comprising following steps:

disposing a pixel definition layer on a side of the pixel electrode layer away from the substrate, wherein a plurality of openings are provided in the pixel definition layer, and the openings respectively correspond to the plurality of pixel electrodes.

Optionally, in some embodiments of the present application, a side of the pixel definition layer close to the substrate is liquid-philic, and a side of the pixel definition layer away from the substrate is liquid-phobic.

An embodiment of the present application provides a drying device for drying a substrate to be dried comprising a substrate, a pixel electrode layer and a solution of light-emitting functional layer, wherein the pixel electrode layer is disposed on the substrate, the solution of the light-emitting functional layer is disposed on the pixel electrode layer, and the drying device comprises:

a chamber;

an air evacuation member, wherein the evacuation member is arranged on the chamber, and the air extraction part is configured to evacuate air from the chamber; and a conductive member, wherein the conductive member is provided in the chamber, and the conductive member is configured to electrically connect the pixel electrode layer to form an electric field for drying on the pixel electrode layer.

Optionally, in some embodiments of the present application, the conductive member comprises at least a first conductive portion and a second conductive portion, the pixel electrode layer comprises a first electrode portion and a second electrode portion that are separately disposed, so that the first conductive portion is connected to the first electrode portion, and the second conductive portion is connected to the second electrode portion to form the electric field for drying on the pixel electrode layer.

Optionally, in some embodiments of the present application, an electrical connector is disposed on the conductive member, the conductive member is movably connected to the electrical connector, and the conductive member contacts the pixel electrode layer through the electrical connector.

Optionally, in some embodiments of the present application, the drying device further comprises a drying member configured to heat the substrate to be dried.

Optionally, in some embodiments of the present application, the drying member comprises a wind drying member.

Optionally, in some embodiments of the present application, the drying member comprises a heating member.

Optionally, in some embodiments of the present application, the heating member is a heating plate, the heating plate is disposed at a bottom of the chamber, and the heating plate is disposed below the conductive member.

The fabrication method of the display panel provided in the present application forms an electric field for drying on a pixel electrode layer to dry the solution of the light-emitting functional layer under the action of the electric field for drying. The electric field for drying provided on the pixel electrode layer is used to fix charged groups in the solution of the light-emitting functional layer, thereby inhibiting movements of the charged groups driven by a solvent when the solvent is volatilized, thereby obtaining a light-emitting functional layer with a uniform film thickness, avoiding formation of a coffee ring, and obtaining high-quality films. In addition, the charged groups are fixed by using the electric field for drying, so that there is no serious air-suction control during a solvent volatilization during a drying process, which greatly simplifies a vacuum drying process and improves a processing efficiency.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
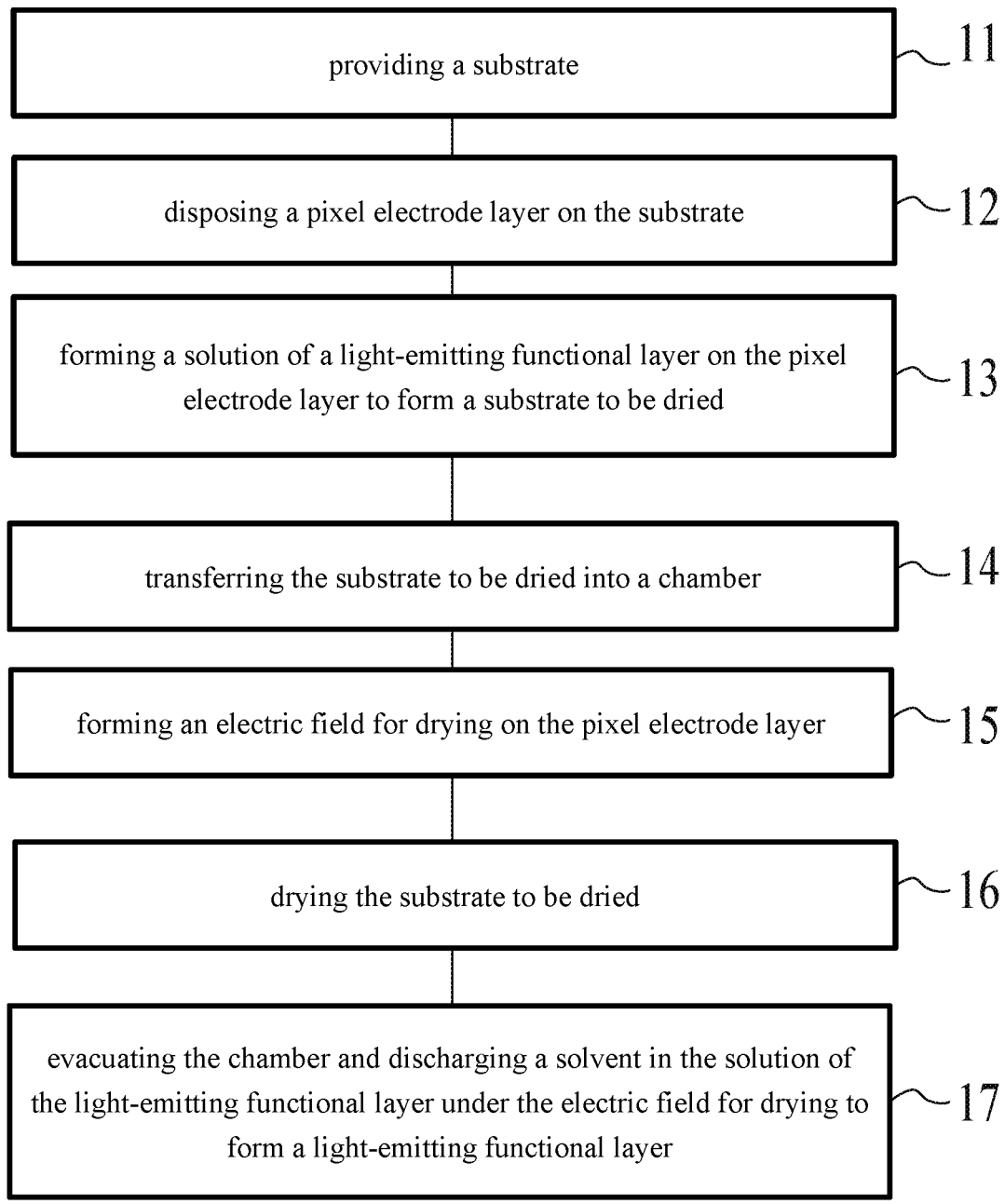
FIG. 1 is a schematic flowchart of a fabrication method of a display panel provided by an embodiment of the present application.

The technical solutions in the embodiments of the present application will be clearly and completely described below in conjunction with the accompanying drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application. In addition, it should be understood that specific implementations described here are only used to illustrate and explain the application and are not used to limit the application. In this application, if no explanation is made to the contrary, the orientation words used such as "upper" and "lower" generally refer to the upper and lower positions of the device in actual use or working state, and specifically refer to the drawing directions in the drawings, and "inner" and "outer" refer to the outline of the device.

The embodiment of the present application provides a fabrication method of a display panel and a drying device. Detailed descriptions are given below. It should be noted that the order of description in the following embodiments is not meant to limit the preferred order of the embodiments.

Please refer to FIG. 1. FIG. 1 is a schematic flowchart of a fabrication method of a display panel provided by an embodiment of the present application. The fabrication method of the display panel provided in the present application specifically comprises following steps:

Step 11: providing a substrate.

Herein, the substrate refers to a base member used to carry a touch electrode structure. For example, the substrate may be made of glass, organic glass, sensor glass, hard insulating film material, soft insulating film material or flexible substrate.

Among them, the sensor glass is obtained by sputtering a coating of a transparent metal oxide conductive film on an ultra-thin glass and then undergoing a high-temperature annealing treatment. A material used for the flexible substrate is a polymer material. Specifically, the material used for the flexible substrate may be polyimide (PI), polyethylene (PE), polypropylene (PP), polystyrene (PS), polyethylene terephthalate (PET), or polyethylene naphthalate (PEN). The polymer material has good flexibility, light weight, and high impact resistance, and is suitable for flexible display panels. Among them, the polyimide can also achieve good heat resistance and stability.

Optionally, after providing a substrate, the method further comprises disposing a plurality of thin film transistor devices on the substrate, and the thin film transistor devices are electrically connected to the pixel electrode layer. The thin film transistor devices can be used to control the voltage of the pixel electrode layer.

Step 12: disposing a pixel electrode layer on the substrate

Specifically, a deposition process can be used to dispose the pixel electrode layer on the substrate, and the pixel electrode layer can be disposed with a transparent metal oxide or a stack of metal and transparent metal oxide. The pixel electrode layer can also use materials such as graphene materials, metal materials, and transition metal chalcogenides.

Specifically, the transition metal chalcogenide comprises molybdenum sulfide ($MoS_2$), molybdenum selenide ($MoSe_2$), tungsten sulfide ($WS_2$), or tungsten selenide ($WSe_2$).

The materials used for the transparent metal oxide layer comprise one of indium gallium zinc oxide, indium zinc tin oxide, indium gallium zinc tin oxide, indium tin oxide, indium zinc oxide, indium aluminum zinc oxide, indium gallium tin oxide or antimony tin oxides. The above materials have good conductivity and transparency, and have a small thickness, which will not affect an overall thickness of the display panel. At the same time, it can also reduce harmful electronic radiations and ultraviolet and infrared light that are harmful to a human body.

The material used for the metal layer is one of silver, aluminum, nickel, chromium, molybdenum, copper, tungsten, or titanium. The metal has good conductivity and low cost, which can reduce the production cost while ensuring conductivity of an anode.

In one embodiment, the pixel electrode layer is deposited as a stack of indium tin oxide/silver/indium tin oxide.

It can be understood that the pixel electrode layer may be the anode or cathode of the light emitting device. In the present application, the pixel electrode layer is used as an anode as an example for description.

Optionally, the pixel electrode layer comprises a plurality of pixel electrodes. After the plurality of pixel electrode layers are provided on the substrate, the method further comprises following steps:

disposing a pixel definition layer on a side of the pixel electrode layer away from the substrate.

Optionally, in some embodiments of the present application, a side of the pixel definition layer close to the substrate is liquid-philic, and a side of the pixel definition layer away from the substrate is liquid-phobic.

The liquid-philic means that a surface of the material is easily wetted or melted by a liquid medium. The liquid-phobic (also called liquid repellency) is the opposite of the liquid-philic. The liquid-phobic means a surface of a material is not easily wetted or melted by a liquid medium. The liquid-philic and liquid-phobic properties of the surface of the material are mainly determined by a nature of its surface structure or functional groups. In the present application, the liquid-philic and liquid-phobic properties of the pixel definition layer can be changed and adjusted by adjusting process parameters. For example, by adjusting the parameters of a development process and a curing process, the liquid-philic and liquid-phobic properties of the pixel definition layer is changed and adjusted. The pixel definition layer provided in this way can be adapted to different printing processes, ink types, and film thicknesses, so that the pixel definition layer can more easily adapt to requirements of different display panels.

Specifically, the thickness of the pixel definition layer will affect the liquid-philic and liquid-phobic properties of the material. For example, when the liquid-phobic material is very thin, it does not have the liquid-phobic property. In addition, an oxygen ($O_2$) or nitrogen ($N_2$) plasma treatment of the material can make the liquid-phobic property becomes liquid-philic, and a fluorine (F) plasma treatment of the material can make the liquid-philic property becomes liquid-phobic.

A plurality of openings are provided in the pixel definition layer, and the openings respectively correspond to the pixel electrodes.

An etching method can be used to provide the openings in the pixel definition layer. Specifically, a wet etching or a dry etching can be used. Furthermore, methods such as chemical etching, electrolytic etching, ion beam sputtering etching, plasma etching, or reactive particle etching can be used. The specific methods are common technical means in this field, and will not be described here again.

Step 13: forming a solution of a light-emitting functional layer on the pixel electrode layer to form a substrate to be dried.

It should be noted that the light-emitting functional layer may comprise a hole injection layer, a hole transport layer, a light emitting layer, an electron transport layer, and an electron injection layer stacked in a direction away from the substrate. The hole injection layer, the hole transport layer, the light-emitting layer, the electron transport layer, the electron injection layer, and the stacked structure thereof are technical features well known to those skilled in the art and will not be described here again. In some embodiments, the light-emitting functional layer may further comprise a hole blocking layer and an electron blocking layer. Therefore, a solution of the light-emitting functional layer in the present application may be a printing solution for any of the above film layers.

Specifically, a hole injection layer solution, a hole transport layer solution, a light-emitting functional layer solution, an electron transport layer solution, or an electron injection layer solution is printed on the pixel electrode layer. The method of printing the light-emitting functional layer can accurately control a film forming area, save materials, reduce costs, and improve product yield.

Optionally, the pixel electrode layer comprises a plurality of pixel electrodes, and forming the solution of the light-emitting functional layer on the pixel electrode layer comprises following steps:

Step 131: forming an electric field for printing between the plurality of pixel electrodes Specifically, the pixel electrode layer is charged to form a voltage difference between the pixel electrode layer and an electric field for printing between the plurality of pixel electrode layers.

Figure 2:
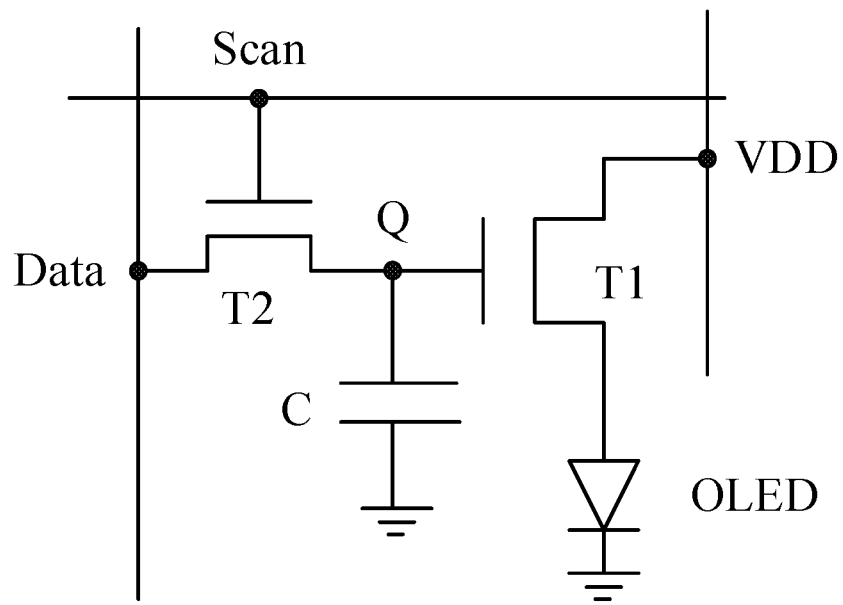
FIG. 2 is a schematic diagram of a pixel circuit formed in a fabrication method of a display panel provided by an embodiment of the present application.

In a display panel, a pixel circuit is usually fabricated first, and then a light-emitting device is fabricated. The pixel circuit shown in FIG. 2 is taken as an example for description. The pixel comprises a driving transistor T1, a switching transistor T2, and a storage capacitor C. An input terminal of the driving transistor T1 is connected to a power supply voltage VDD. An output terminal of the driving transistor T1 is connected to the pixel electrode layer, that is, an anode of a light-emitting device OLED in FIG. 2. A control terminal of the driving transistor T1 is connected to the first node Q. An input terminal of the switching transistor T2 is connected to a data signal Data. An output terminal of the switching transistor T2 is connected to the first node Q. A control terminal of the switching transistor is connected to a scan signal Scan. A first end of the storage capacitor C is connected to the first node Q, and a second end of the storage capacitor C is grounded.

In the present application, by inputting different data signals Data to different pixel electrodes, the plurality of pixel electrodes can be at different potentials. As a result, a voltage difference is formed between the plurality of pixel electrodes, and an electric field for printing is formed between the plurality of pixel electrodes.

Figure 3:
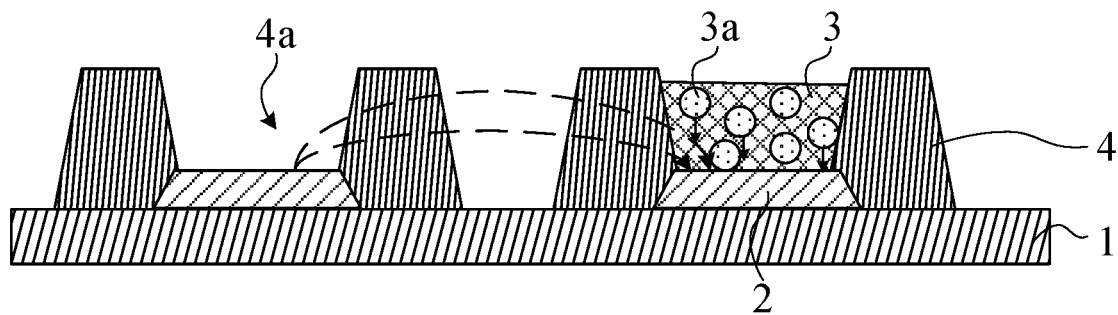
FIG. 3 is a schematic diagram of an electric field generated between pixel electrode layers in a fabrication method of a display panel provided by an embodiment of the present application.

Step 132: printing the solution of the light-emitting functional layer to the plurality of pixel electrodes under the action of the electric field for printing Specifically, please refer to FIG. 3. FIG. 3 is a schematic diagram of an electric field for printing generated between a plurality of pixel electrodes provided by an embodiment of the present application. In the present embodiment, a light-emitting functional layer 3 is printed under the action of the electric field for printing. In the pixel electrode layer 2, the electric field for printing formed between the plurality of pixel electrodes has a horizontal component and a vertical component. The vertical component of the electric field for printing provides charged groups 3a in a solution of the light-emitting functional layer 3 with a force to deposit on the pixel electrode layer 2, which can promote the charged groups 3a in the solution of the light-emitting functional layer 3 to deposit on the pixel electrode layer 2 during printing.

It should be noted that the above hole injection layer, hole transport layer, light emitting layer, electron transport layer and electron injection layer can all be printed under the electric field. In the printing process, by adjusting the voltage difference between the pixel electrode layers, printing requirements of different film layers can be adapted.

Optionally, a pixel definition layer 4 and an opening 4a may be provided on the pixel electrode layer 2 to better prevent overflow of the solution of the light-emitting functional layer 3. Alternatively, the pixel electrode layer 2 is divided into two electrodes, and then a pixel definition layer 4 is disposed on the pixel electrode layer 2 to accommodate the light-emitting functional layer 5. Of course, the pixel defining layer 4 and the opening 4a may not be disposed when printing the solution of the light-emitting functional layer 3 under the action of the electric field for printing. When printing the solution of the light-emitting functional layer 3, the electric field for printing is formed between the pixel electrode layers 2. That is, positive and negative poles forming the electric field for printing are on the pixel electrode layer 2, and the effect of the electric field for printing can make the solution of the light-emitting functional layer 3 accurately deposit on the patterned pixel electrode layer 2. Therefore, the production of the pixel definition layer 4 can be omitted, and the process can be simplified. It should be noted that when the charged groups in the solution of the light-emitting functional layer 3 are positively charged, the pixel electrode layer 2 where the light-emitting functional layer 3 needs to be deposited should be the negative electrode, and vice versa.

Optionally, the pixel electrode layer comprises a plurality of pixel electrodes, and the plurality of pixel electrodes comprise a plurality of sub-pixel electrodes arranged in m rows and n columns, wherein m and n are positive integers greater than or equal to 1, and values of m and n are not equal to 1 at the same time.

It should be noted that the pixel electrode is appropriately divided, and a proportion of an area of a divided region in an area of the entire sub-pixel is controllable. Therefore, dividing a pixel electrode in m rows and n columns of sub-pixel electrodes 2a will not affect the light-emitting effect. For example, taking m equals to 2 and n equals to 2 as an example, the pixel electrode is divided into four sub-pixel electrodes arranged in 2 rows and 2 columns.

Specifically, the pixel electrode can be divided by etching. As a process permits, methods such as laser cutting can also be used. Optionally, after the pixel electrode layer is divided, it is filled with photoresist or passivation layer material, or it can be filled with the deposited film of the upper layer during deposition on the entire surface.

Herein, a distance of a gap between the sub-pixel electrode and the sub-pixel electrode is 1 μm to 10 μm. Specifically, the distance of the gap between the sub-pixel electrode is 1 μm, 2 μm, 3 μm, 5 μm, 7 μm, 8 μm, 9 μm, or 10 μm. Setting the distance of the gap of the sub-pixel electrodes to 1 μm to 10 μm can consider the precision requirements of the fabrication process and the light-emitting effect.

Optionally, forming the light-emitting functional layer solution on the pixel electrode layer comprises forming the electric field for printing between the sub-pixel electrodes.

Herein, each of the plurality of thin film transistors correspondingly controls a voltage of one row of the plurality of sub-pixel electrodes or each of the plurality of thin film transistors correspondingly controls a voltage of one column of the plurality sub-pixel electrodes, or each of the plurality of thin film transistors correspondingly controls one of the plurality of sub-pixel electrodes, thereby controlling formation of a voltage difference between the plurality of sub-pixel electrodes Each of the thin film transistor devices controls a voltage of a row of sub-pixel electrodes or correspondingly controls a voltage of a column of sub-pixel electrodes, which can form high and low potentials in the sub-pixels. The high and low potentials between the rows and columns cause a voltage difference between the sub-pixel electrodes and the sub-pixel electrodes to further form an electric field. An intensity of the electric field between the sub-pixel electrodes is relatively large, which can provide sufficient electric field force to assist the printing process of the light-emitting functional layer 3. Moreover, this method requires fewer thin film transistor devices, which can reduce the difficulty and accuracy of the fabrication process.

Herein, each thin film transistor device correspondingly controls the voltage of a row of sub-pixel electrodes, or each thin film transistor device correspondingly controls the voltage of one column of sub-pixel electrodes, or each thin film transistor device correspondingly controls the voltage of one sub-pixel electrode.

Each thin film transistor device controls the voltage of a row of sub-pixel electrodes or correspondingly controls the voltage of a column of sub-pixel electrodes, which can already form high and low potentials in the sub-pixels. The high and low potentials between the rows and columns cause a voltage difference between the sub-pixel electrodes and the sub-pixel electrodes to further form an electric field in the printing stage. The intensity of the electric field between the sub-pixel electrodes is relatively large, which can provide sufficient electric field force to assist the printing process of the light-emitting functional layer. Moreover, this method requires fewer thin film transistor devices, which can reduce the difficulty and accuracy of the manufacturing process.

In this way, high and low potentials can be formed in the sub-pixels. The high and low potentials between the rows and columns cause a voltage difference between the sub-pixel electrodes to further form an electric field. The intensity of the electric field between the sub-pixel electrodes is relatively large, which can provide sufficient electric field force to assist the printing process of the light-emitting functional layer. Moreover, this method requires fewer thin film transistor devices, which can reduce the difficulty and accuracy of the fabrication process.

Each thin film transistor device correspondingly controls a voltage of a sub-pixel electrode, so that a voltage difference is formed between the sub-pixel electrodes. This setting method can finely control the potential difference in the sub-pixels and the electric field in the printing stage.

Optionally, printing the light-emitting functional layer solution on the pixel electrode layer comprises following steps:

Step 13A: disposing an electric field electrode layer on the substrate, and the electric field electrode layer is insulated from the pixel electrode layer.

Herein, the term "insulating from" means that there is a gap between the pixel electrode layer and the electric field electrode layer. In some embodiments, an inorganic film layer such as a passivation layer, an interlayer insulating layer, or a buffer layer is disposed between the pixel electrode layer and the electric field electrode layer for insulation. Specific setting method can be adaptively changed according to the specific display panel and will not be described here again.

It should be noted that, that the pixel electrode layer and the electric field electrode layer are arranged on the substrate in this application means that the pixel electrode layer and the electric field electrode layer are arranged on the same side of the substrate. It is not limited that the pixel electrode layer and the electric field electrode layer are arranged close to the surface of the substrate.

Figure 4:
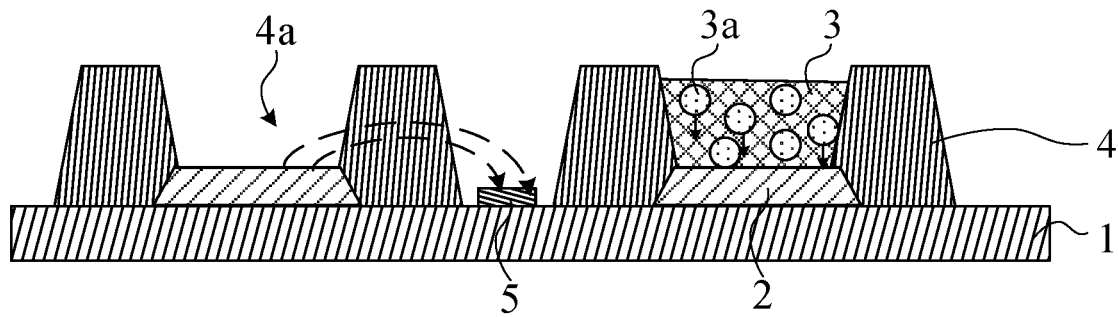
FIG. 4 is a schematic diagram of an electric field generated between a pixel electrode layer and an electrode layer in a fabrication method of a display panel provided by an embodiment.

Step 13B: forming an electric field for printing between the pixel electrode layer and the electric field electrode layer Please refer to FIG. 4. FIG. 4 is a schematic diagram of an electric field for printing generated between the pixel electrode layer and the electric field electrode layer provided by an embodiment. The electric field for printing is indicated by the dotted line in the figure. The pixel electrode layer 2 and the electric field electrode layer 5 are charged to form a voltage difference between the pixel electrode layer 2 and the electric field electrode layer 5, and then an electric field for printing is formed between the pixel electrode layer 2 and the electric field electrode layer 5. Specifically, a first voltage is applied to the pixel electrode layer 2 and a second voltage is applied to the electric field electrode layer 5. A voltage difference is formed between the pixel electrode layer 2 and the electric field electrode layer 5 to form an electric field for printing between the pixel electrode layer 2 and the electrode layer 5.

Specifically, the electric field electrode layer 5 may be a signal wiring layer or an auxiliary electrode layer. The signal wiring layer may be a data signal wiring layer for inputting data signals to the pixel circuit. The signal wiring layer can also be any other wiring in the pixel circuit, if it can form a voltage difference with the pixel electrode layer. The auxiliary electrode layer can be used to connect a cathode to reduce the voltage drop of the cathode.

Step 13C: printing the solution of the light-emitting functional layer on the pixel electrode layer under the action of the electric field for printing The method of printing the solution of the light-emitting functional layer will not be described here again.

Step 14: transferring the substrate to be dried into a chamber.

After printing the solution of the light-emitting functional layer, the solution of the light-emitting functional layer is planarized and the substrate to be dried is transferred into the chamber.

Step 15: forming an electric field for drying on the pixel electrode layer

Figure 5:
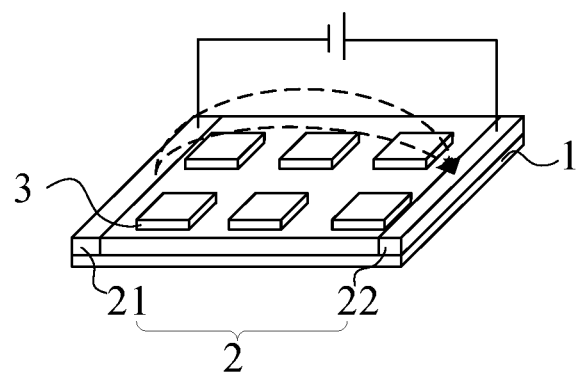
FIG. 5 is a schematic diagram of an electric field formed during drying in a fabrication method of a display panel provided by an embodiment of the present application.

Specifically, please refer to FIG. 5. FIG. 5 is a schematic diagram of an electric field for drying formed during drying according to an embodiment of the present application. The pixel electrode layer 2 is disposed on the substrate 1. Voltages are applied to both ends of the pixel electrode layer 2 of the substrate to be dried, so that a voltage difference is formed between the two ends of the pixel electrode layer 2 and a horizontal electric field is formed on the pixel electrode layer 2. The electric field for drying is indicated by the dotted line in the figure. The electric field for drying formed on the pixel electrode layer 2 has a horizontal component and a vertical component. The vertical component of the electric field provides the charged groups in the solution of the light-emitting functional layer 3 with a force to deposit on the pixel electrode layer 2.

Optionally, a conductive member is disposed in the chamber. An electric field for drying is formed on the pixel electrode layer, including connecting the conductive component and the pixel electrode layer. The conductive member is charged to form the electric field for drying on the pixel electrode layer.

Optionally, the conductive component comprises a first conductive portion and a second conductive portion, and the pixel electrode layer comprises a first electrode portion and a second electrode portion that are separately disposed. The step of forming an electric field for drying on the pixel electrode layer specifically comprises following steps:

Step 151: connecting the first conductive portion and the first electrode portion and connecting the second conductive portion and the second electrode portion.

Step 152: applying a first voltage to the first conductive part and applying a second voltage to the second conductive part. A voltage difference is formed between the first electrode portion and the second electrode portion to form the electric field for drying on the pixel electrode layer.

Optionally, in some embodiments of the present application, the voltage difference is 1 volt to 500 volts (V). Further, the voltage difference is 5V to 200V. The voltage difference can be 1V, 5V, 10V, 15V, 20V, 25V, 50V, 100V, 150V, 200V, 300V, 400V, 450V or 500V. Correspondingly, in some embodiments of the present application, the electric field intensity of the electric field in the drying stage is 0.01 volts/micrometer to 100 volts/micrometer (V/μm). Specifically, the electric field intensity of the electric field in the drying stage can be 0.01V/μm, 0.05V/μm, 0.1V/μm, 0.5V/μm, 1V/μm, 5V/μm, 10V/μm, 15V/μm, 20V/μm, 25V/μm, 50V/μm, 55V/μm, 60V/μm, 75V/μm, 80V/μm, 85V/μm, 90V/μm, 95V/μm or 100V/μm. Of course, the electric field strength in the drying stage is not limited to the above-listed values. Similarly, the voltage difference and the electric field strength of the electric field in the printing stage can also adopt the above numerical range, which will not be repeated here.

Excessive voltage difference may cause electrostatic damage. If the voltage difference is too small, the electric field for drying stage may be weak, and sufficient electric field force cannot be provided, so that the charged particles in the solution of the light-emitting functional layer cannot be fixed on the pixel electrode layer, which affects the performance of the light-emitting functional layer after solvent separation and film uniformity. Therefore, an appropriate electric field strength is between 0.01 volts/micron to 100 volts/micron (V/μm).

It should be noted that the above embodiments describe a method of generating an electric field for drying on the pixel electrode layer by using the pixel electrode layer as an electrode. In some embodiments, an external electric field can also be used to generate an electric field on the pixel electrode layer. For example, external electrodes are added to the left and right sides of the pixel electrode layer to form a horizontal electric field. Alternatively, external electrodes are added on the upper and lower sides of the pixel electrode layer to form a vertical electric field. The present application does not limit the generation method of the electric field for drying.

Step 16: drying the substrate to be dried

Specifically, the method for drying the substrate to be dried comprises forming a negative pressure environment in the chamber. Alternatively, the substrate to be dried is heated.

The boiling point of liquid compounds is closely related to pressure. When the pressure decreases, the boiling temperature of the liquid decreases, that is, the boiling point decreases. Therefore, in a negative pressure environment, the boiling point of the solvent in the solution of the light-emitting functional layer can be lowered. When the solution of the printed light-emitting layer has a higher boiling point, the solvent evaporates more slowly. Therefore, it is necessary to use a vacuum drying method to remove most of the solvent. Therefore, the vacuum drying method can better remove the solvent in the solution of the light-emitting functional layer.

Heating the substrate to be dried can evaporate the solvent, or the substrate to be dried is heated while reducing the pressure in the chamber. For solvents with higher boiling points, the solvent cannot be completely volatilized and pumped away only by pumping. Therefore, the substrate to be dried can be heated while pumping air. This method uses the principle of vacuum distillation to separate solvents and is especially suitable for the solution of the light-emitting functional layer with a solute having poor thermal stability of Specifically, heating the chamber while pumping air can evaporate the solvent at a relatively low temperature, and has little impact on the solute. In the present application, the material in the light-emitting functional layer is not suitable for being exposed to a high temperature for a long time. Therefore, using this method of reduced pressure distillation to separate the solvent at a low temperature can also avoid damage to the material of the light-emitting functional layer.

Step 17: evacuating the chamber and discharging a solvent in the solution of the light-emitting functional layer under the electric field for drying to form a light-emitting functional layer In the present application, the chamber is evacuated under the electric field for drying. As described above, the vertical component of the electric field for drying provides the charged groups in the solution of the light-emitting functional layer with a force for deposition on the pixel electrode layer. Therefore, during vacuum drying, the electric field for drying can be used to fix the charged groups in the light-emitting functional layer, thereby inhibiting the movement of the solvent to drive the charged groups when the solvent volatilizes, thereby obtaining a light-emitting functional layer film with a uniform film thickness and avoiding formation of the coffee ring.

The fabrication method of the display panel provided in the present application forms an electric field for drying on a pixel electrode layer to dry the solution of the light-emitting functional layer under the action of the electric field for drying. The electric field for drying provided on the pixel electrode layer is used to fix charged groups in the solution of the light-emitting functional layer, thereby inhibiting movements of the charged groups driven by a solvent when the solvent is volatilized, thereby obtaining a light-emitting functional layer with a uniform film thickness, avoiding formation of a coffee ring, and obtaining high-quality films. In addition, the charged groups are fixed by using the electric field for drying, so that there is no serious air-suction control during a solvent volatilization during a drying process, which greatly simplifies a vacuum drying process and improves a processing efficiency.

In addition, the fabrication method of the display panel provided by the present application can also apply an electric field for printing when printing the light-emitting functional layer, which can assist the deposition of the light-emitting functional layer under the action of the electric field for printing, so that the deposition of the light-emitting functional layer is more uniform and avoid formation of the coffee ring.

Figure 6:
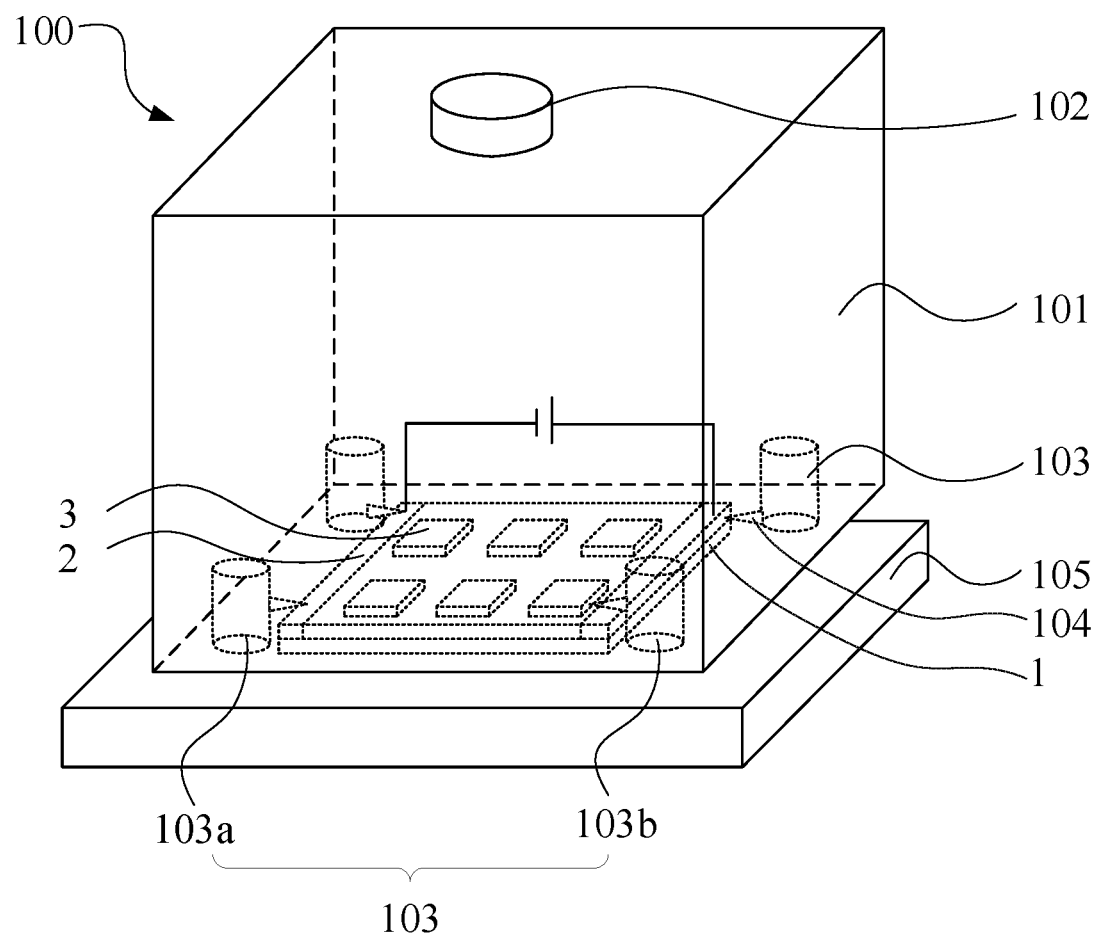
FIG. 6 is a schematic structural diagram of a drying device provided in an embodiment of the present application.

Please refer to FIG. 6. FIG. 6 is a schematic structural diagram of a drying device provided by an embodiment of the present application. The present application provides a drying device 100, which is used in a drying process of a substrate to be dried. The drying device 100 can be used in the drying process after printing the light-emitting functional layer 3, and the substrate to be dried comprises the substrate 1, the pixel electrode layer 2 and the solution of the light-emitting functional layer 3. The pixel electrode layer 2 is disposed on the substrate. The solution of the light-emitting functional layer 3 is disposed on the pixel electrode layer 2. It should be noted that the drying device 100 can also be used for drying other printed films.

The drying device comprises a chamber 101, an air evacuation member 102 and a conductive member 103. The air evacuation member 102 is arranged on the chamber 101. The air evacuation member 102 is configured to evacuate air from the chamber 101. The conductive member 103 is provided in the chamber 101. The conductive member 103 is used to electrically connect the pixel electrode layer 2 to form an electric field for drying on the pixel electrode layer 2.

The drying device 100 provided in the present application is used for drying various nano-film layers. Specifically, it includes that the solute is one or more combinations of inorganic nanoparticles, noble metal nanoparticles, colloidal nanosheets, and colloidal nanorod nano-film layers. Further, the nanoparticles can be barium sulfate ($BaSO_4$), calcium carbonate ($CaCO_3$), cesium zinc (ZnSe), cadmium sulfide (CdS), titanium dioxide ($TiO_2$), barium titanate ($BaTiO_3$), zinc sulfide (ZnS), One or more combinations of zirconium oxide ($ZrO_2$), silicon nitride ($Si_3N_4$), tin oxide (SnO), and zinc oxide (ZnO).

The solute in the solution of the light-emitting functional layer 3 in the present application may be a quantum dot material. Specifically, the light-emitting core material of the quantum dot material is one or more combinations of $ZnCdSe_2$, InP, $Cd_2SSe$, CdSe, $Cd_2SeTe$, and InAs. The inorganic protective shell material of the quantum dot material is one or a combination of CdS, ZnSe, $ZnCdS_2$, ZnS, and ZnO. Quantum dot materials may also comprise hydrogel loaded quantum dot structures, $CdSe$—$SiO_2$ quantum dots, and perovskite quantum dots. The surface ligands of quantum dot materials comprise one or a combination of amines, acids, mercapto alcohols, and organophosphorus. The solvent in the solution of the light-emitting functional layer 3 may be a colorless, transparent, and low-boiling organic or inorganic solvent. For example, the solvent may be one or a combination of deionized water, methanol, ethanol, ethylene glycol, propylene glycol, ethyl acetate, petroleum ether, or n-hexane.

It should be noted that the chamber 101 in the present application is a closed chamber with only an opening at the bottom and the air evacuation member 102 at the top. The chamber 101 is provided to protect the pixel electrode layer 2 and the solution of the light-emitting functional layer 3 during the drying process to prevent dust, ash, and impurity particles from entering. It can be understood that the chamber 101 in the present application may also be set as an unclosed chamber, which is not limited in the present application. Optionally, the chamber 101 is a transparent chamber, which is convenient for monitoring the volatilization of the solvent during the drying process.

Optionally, the air evacuation member 102 is arranged at the top of the chamber 101. Alternatively, the air evacuation member 102 may also be arranged on the side wall or the bottom of the chamber 101. The air evacuation member 102 in the present application is used to evacuate the solvent evaporated from the solution of the light-emitting functional layer 3. When the solvent is evaporated under heating, the evaporated solvent will be discharged upward when heated. Therefore, arranging the air evacuation member 102 on the top of the chamber 101 can better evacuate the evaporated solvent. The air extraction component 102 is arranged on the side wall or bottom of the chamber 101 and can evacuate air closer to the position where the solvent evaporates, so that the power and evacuation intensity requirements of the air extraction component 102 can be reduced.

Optionally, please refer to FIG. 5 and FIG. 6 at the same time. The conductive member 103 comprises at least a first conductive portion 103a and a second conductive portion 103b. The pixel electrode layer 2 comprises a first electrode portion 21 and a second electrode portion 22 that are separately disposed. The first conductive portion 103a and the second conductive portion 103b are respectively connected to both ends of the pixel electrode layer to form an electric field on the pixel electrode layer. It can be understood that the first conductive portion 103a and the second conductive portion 103b may each be provided in multiples. Also, the numbers of the first conductive portion 103a and the second conductive portion 103b may be the same or different. As shown in FIG. 6, the numbers of the first conductive portions 103a and the second conductive portions 103b are the same, and the first conductive portions 103a and the second conductive portions 103b are symmetrically arranged.

The pixel electrode layer 2 provided in the present application can be specially patterned. That is, the pixel electrode layer 2 is designed to have a symmetrical structure in both end regions where the light-emitting functional layer 3 is not provided. The first conductive portion 103a and the second conductive portion 103b are respectively connected to the symmetrical structure at both ends of the pixel electrode layer 2 to form a horizontal electrode pair, thereby forming a uniform horizontal electric field on the pixel electrode layer 2. The pixel electrode layer 2 can also be arranged as two interdigitated electrodes insulated from each other, and then a pixel defining layer 4 is arranged on the interdigitated electrodes to pattern the pixel electrode layer 2. In addition, the pixel electrode layer 2 may also be a patterned electrode on the entire surface. The application does not limit the patterning of the pixel electrode layer 2.

The conductive member 103 in the present application can communicate inside and outside of the chamber 101. A magnitude of a voltage applied to the conductive member 103 is controlled by an external control device (not shown in the figure). Herein, a high potential level and a low potential level are respectively applied to the first conductive portion 103a and the second conductive portion 103b, so that a voltage difference is generated between the two ends of the pixel electrode layer 2. Alternatively, the conductive member 103 is disposed inside the chamber 101, and a wire connecting the conductive member 103 communicates with the inside and outside of the chamber.

The conductive member 103 may be a conductive pillar. The conductive pillar is arranged at the bottom of the chamber 101 and communicates with a circuit outside the chamber 101. The external circuit can control the voltage transmitted from the conductive pillar to the pixel electrode layer 2. The use of a pillar as the conductive member 103 can make the conductive member 103 more stable and transmit current more uniformly. Of course, the conductive member 103 can also have other shapes, which is not limited here.

Optionally, an electrical connector 104 is provided on the conductive member 103. The conductive member 103 is fixed on the chamber, and the substrate to be dried of different sizes is difficult to adapt to the position of the conductive member 103. Therefore, the conductive member 103 is movably connected to the electrical connector 104 and contacts the pixel electrode layer 2 through the electrical connector 104. The arrangement of the electrical connection member 104 can make the electric field on the pixel electrode layer 2 more controllable. On the one hand, during the drying process, the electrical connections between the plurality of first conductive portions 103a and the second conductive portions 103b and the pixel electrode layer 2 can be adjusted, to adjust the direction and intensity of the electric field. On the other hand, after the solvent of the solution of the light-emitting functional layer 3 in a substrate to be dried is drawn, the electrical connector 104 can be disconnected from the pixel electrode layer 2 by the control device, and the dried substrate can be controlled to move out of the chamber 101. Then, a next substrate to be dried is transferred into the chamber 101, and the electrical connection member 104 is controlled to be electrically connected to the pixel electrode layer 2 through the control device.

Specifically, the electrical connector 104 may be a probe. First, the probe is controlled to lift, and after the substrate to be dried is transferred into the chamber 101, the probe is dropped, so that the conductive member 103 is electrically connected to the pixel electrode layer 2 through the probe. When the solvent in the solution of the light-emitting functional layer 3 is completely dried, the probe is lifted again, and then the substrate is transferred out of the chamber 101, and so on. Since the conductive member 103 is fixed and cannot adapt to the sizes of various pixel electrode layers 2, the pixel electrode layers 2 of different sizes and different shapes can be connected by setting probes, which is beneficial to the application of the drying device 100.

Specifically, the probe can stretch on the conductive member 103 to adapt to the different distances between the conductive member 103 and the pixel electrode layer 2.

Optionally, the drying device 100 further comprises a drying member 105. The drying member 105 is configured to dry the chamber 101. Optionally, the drying member 105 may be a wind drying member or a heating member. Of course, the drying member 105 is not limited to the above examples. For example, for a solvent with a higher boiling point, it cannot be completely volatilized and pumped away only by pumping. Therefore, the chamber 101 can be heated while pumping air. This method uses the principle of reduced pressure distillation to separate the solvent and is especially suitable for the solution of the light-emitting functional layer 3 with poor thermal stability of the solute. When the chamber 101 is heated while pumping air, the solvent can be evaporated at a lower temperature, and the influence on the solute is small. In the present application, the material in the light-emitting functional layer 3 is not suitable for being exposed to high temperature for a long time. Therefore, using this method of reduced pressure distillation to separate the solvent at low temperature can also avoid damage to the light-emitting functional layer material.

Specifically, the heating member is a heating plate, and the heating plate is arranged at the bottom of the chamber 101. A heating plate is selected to be set at the bottom of the chamber 101 to heat the chamber 101, and the position of the heating plate is close to the solution of the light-emitting functional layer 3, which can better conduct heat conduction. In addition, the heating plate can uniformly heat the solution of the light-emitting functional layer 3 so that the solution of the light-emitting functional layer 3 on the pixel electrode layer 2 simultaneously volatilizes. The heating plate can be arranged outside the chamber 101 or directly made as the bottom plate of the chamber 101. The temperature of the heating plate is adjustable and can adapt to solvents with different boiling points. It is understandable that the heating member can also be a water bath heating member, an oil bath heating member, or a heating wire, etc. The heating member can be arranged at the bottom, side walls or surrounding the chamber 101, which is not limited in the present application.

Specifically, the heating plate may be arranged on the outside of the bottom of the chamber 101, or the heating plate may directly serve as the bottom of the chamber 101 and form the chamber 101 together with other side walls and the top cover. When the heating plate is directly used as the bottom of the chamber 101, the heating plate and the conductive component 103 are arranged at intervals. For example, the conductive member 103 is provided on the side wall of the chamber 101. Alternatively, a heat insulation board is arranged in the chamber 101, and the heat insulation board is arranged above the heating plate. Then, the conductive member 103 is arranged on the heat insulation board, and the conductive member 103 is connected to the pixel electrode layer 2 through the electrical connector.

The drying device 100 provided in the present application comprises a chamber 101, an air evacuation member 102 and a conductive member 103. The pixel electrode layer 2 is connected through the conductive member 103 to form an electric field on the pixel electrode layer 2. When the chamber 101 is evacuated to dry the solution of the light-emitting functional layer 3, the electric field on the pixel electrode layer 2 fixes the charged groups in the solution of the light-emitting functional layer 3. This prevents the solvent from driving the movement of the charged groups when the solvent is volatilized, thereby obtaining the light-emitting functional layer 3 with a uniform film thickness and avoiding the occurrence of the coffee ring. Moreover, the use of an electric field to fix the charged groups does not require strict pumping control during the solvent volatilization process. The drying device 100 is configured to perform drying treatment, which greatly simplifies the vacuum drying process and improves the processing efficiency.

The above is a detailed introduction to a fabrication method of a display panel and a drying device provided by an embodiment of the present application. Specific examples are used in this article to illustrate the principles and implementation of the present application. Its core idea, at the same time, for those skilled in the art, according to the idea of this application, there will be changes in the specific implementation and scope of application. In summary, the content of the present specification should not be construed as a limitation to this application.

What is claimed is:

1. A method of fabricating a display panel, comprising:
   providing a substrate;
   disposing a pixel electrode layer on the substrate;
   forming a light-emitting functional layer solution on the pixel electrode layer to form a base plate;
   transferring the base plate into a chamber;
   forming a drying stage electric field on the pixel electrode layer;
   drying the base plate; and
   evacuating the chamber under the drying stage electric field to discharge a solvent in the light-emitting functional layer solution to form a light-emitting functional layer.

2. The method according to claim 1, wherein a conductive member is disposed in the chamber, the conductive member comprises a first conductive portion and a second conductive portion, and the pixel electrode layer comprises a first electrode portion and a second electrode part that are separated,
   wherein the forming of the drying stage electric field on the pixel electrode layer comprises:
   connecting the first conductive portion to the first electrode portion, and connecting the second conductive portion to the second electrode portion; and
   applying a first voltage to the first conductive portion and a second voltage to the second conductive portion to form a voltage difference between the first electrode portion and the second electrode portion, so that the drying stage electric field is formed between the first electrode portion and the second electrode portion.

3. The method according to claim 2, wherein the voltage difference is 1 volt to 500 volts.

4. The method according to claim 2, wherein the voltage difference is 5 volts to 200 volts.

5. The method according to claim 1, wherein an electric field intensity of the drying stage electric field is from 0.01 volt/micrometer to 100 volt/micrometer.

6. The method according to claim 1, wherein the pixel electrode layer comprises a plurality of pixel electrodes, and
the forming of the light-emitting functional layer solution on the pixel electrode layer comprises:
forming a printing stage electric field between the plurality of pixel electrodes; and
printing the light-emitting functional layer solution on the plurality of pixel electrodes under the printing stage electric field.

7. The method according to claim 1, wherein the pixel electrode layer comprises a plurality of pixel electrodes, each of the plurality of pixel electrodes comprises a plurality of sub-pixel electrodes arranged in m rows and n columns, and a gap is formed between every two adjacent ones of the sub-pixel electrodes, wherein each of m and n a positive integer greater than or equal to 1, and at least one of m and n is not equal to 1,
wherein the forming of the light-emitting functional layer solution on the pixel electrode layer comprises:
forming a printing stage electric field between the plurality of sub-pixel electrodes; and
printing the light-emitting functional layer solution on the each of the plurality of pixel electrodes under the printing stage electric field.

8. The method according to claim 7, further comprising: after providing the substrate,
disposing a plurality of thin film transistors on the substrate, wherein the thin film transistors are electrically connected to the plurality of sub-pixel electrodes,
wherein each of the plurality of thin film transistors correspondingly controls a voltage of one of the m rows of the plurality of sub-pixel electrodes, or each of the plurality of thin film transistors correspondingly controls a voltage of one of the n columns of the plurality sub-pixel electrodes, or each of the plurality of thin film transistors correspondingly controls one of the plurality of sub-pixel electrodes, so that the plurality of thin film transistors control to form a voltage difference between the plurality of sub-pixel electrodes to form the printing stage electric field between the plurality of sub-pixel electrodes.

9. The method according to claim 7, wherein the gap has a length of 1 μm to 10 μm.

10. The method according to claim 1, wherein the forming of the light-emitting functional layer solution on the pixel electrode layer comprises:
disposing an electric field electrode layer on the substrate, wherein the electric field electrode layer is insulated from the pixel electrode layer;
forming a printing stage electric field between the pixel electrode layer and the electric field electrode layer; and
printing the light-emitting functional layer solution on the pixel electrode layer under the printing stage electric field.

11. The method according to claim 10, wherein the forming of the printing stage electric field between the pixel electrode layer and the electric field electrode layer comprises:
applying a first voltage to the pixel electrode layer and a second voltage to the electric field electrode layer to form a voltage difference between the pixel electrode layer and the electric field electrode layer, so that the printing stage electric field is formed between the pixel electrode layer and the electric field electrode layer.

12. The method according to claim 1, wherein the pixel electrode layer comprises a plurality of pixel electrodes,
the method further comprising: after disposing the pixel electrode layer on the substrate,
disposing a pixel definition layer on a side of the pixel electrode layer away from the substrate, wherein the pixel definition layer is provided with a plurality of openings that respectively correspond to the plurality of pixel electrodes.

13. The method according to claim 12, wherein a side of the pixel definition layer close to the substrate is liquid-philic, and a side of the pixel definition layer away from the substrate is liquid-phobic.

14. A drying device for drying a base plate comprising a substrate, a pixel electrode layer and a light-emitting functional layer solution, wherein the pixel electrode layer is disposed on the substrate, and the light-emitting functional layer solution is formed on the pixel electrode layer,
the drying device comprising:
a chamber;
an evacuation member, wherein the evacuation member is arranged on the chamber to evacuate the chamber; and
a conductive member, wherein the conductive member is provided in the chamber, and the conductive member is electrically connectable to the pixel electrode layer to form a drying stage electric field on the pixel electrode layer.

15. The drying device according to claim 14, wherein the conductive member comprises at least a first conductive portion and a second conductive portion,
the pixel electrode layer comprises a first electrode portion and a second electrode portion that are separately disposed, and
the first conductive portion is connectable to the first electrode portion and the second conductive portion is connectable to the second electrode portion to form the drying stage electric field on the pixel electrode layer.

16. The drying device according to claim 15, wherein an electrical connector is disposed on the conductive member, and the conductive member is movably connected to the electrical connector to contact the pixel electrode layer through the electrical connector.

17. The drying device according to claim 15, wherein the drying device further comprises a drying member configured to heat the base plate.

18. The drying device according to claim 17, wherein the drying member comprises a wind drying member.

19. The drying device according to claim 18, wherein the drying member comprises a heating member.

20. The drying device according to claim 19, wherein the heating member is a heating plate, the heating plate is disposed at a bottom of the chamber, and the heating plate is disposed below the conductive member.

* * * * *